United States Patent [19]

Chisholm

[11] 4,285,123
[45] Aug. 25, 1981

[54] PIN REMOVAL TOOL

[75] Inventor: William M. Chisholm, Midlothian, Va.

[73] Assignee: Western Electric Co., Inc., New York, N.Y.

[21] Appl. No.: 106,115

[22] Filed: Dec. 21, 1979

[51] Int. Cl.³ ............................................. H05K 3/30
[52] U.S. Cl. ...................................... 29/764; 29/258; 29/758
[58] Field of Search ................. 29/764, 758, 739, 741, 29/845, 256, 258

[56] References Cited

U.S. PATENT DOCUMENTS

| | | | |
|---|---|---|---|
| 2,976,608 | 3/1961 | Busler | 29/764 |
| 3,087,235 | 4/1963 | Porter | 29/764 |
| 3,136,040 | 6/1964 | Bauer et al. | 29/764 |
| 3,210,836 | 10/1965 | Johanson et al. | 29/278 |
| 3,588,983 | 6/1971 | Hoy | 29/764 |
| 4,028,790 | 6/1977 | Dupuis | 29/764 |
| 4,070,755 | 1/1978 | Carter | 29/764 |
| 4,168,569 | 9/1979 | Fairbairn | 29/764 |
| 4,206,543 | 6/1980 | Chisholm | 29/739 |

Primary Examiner—Carl E. Hall
Attorney, Agent, or Firm—J. B. Hoofnagle

[57] ABSTRACT

A pin-removal tool (36) for removing a damaged or defective pin (23a) from a printed wiring board (21) includes a handle (37) and a shaft (38) extending from one end of the handle. The tool (21) further includes a sleeve (58) which is threadedly attached to the shaft (23) to facilitate rotational and axial movements therebetween. A pin-removal member (39) is fixedly attached to the shaft (38). The pin-removal member (39) includes a bore (42), a transverse slot (44) at one end of the member and a pair of shoulder-retaining portions (55) which aid in the removal of the pin (23). Laterally extending shoulders (29) of the pin (23a) are positioned within the slot (44) and the tool (36) is rotated ninety degrees to position the portions (55) adjacent to the shoulders. The sleeve (58) is then rotated while being held axially against the board 10. Upon rotation of the sleeve (58), the shaft (38) moves axially within the sleeve whereby the portions (55) pull the pin (23a) axially from the board (21).

12 Claims, 11 Drawing Figures

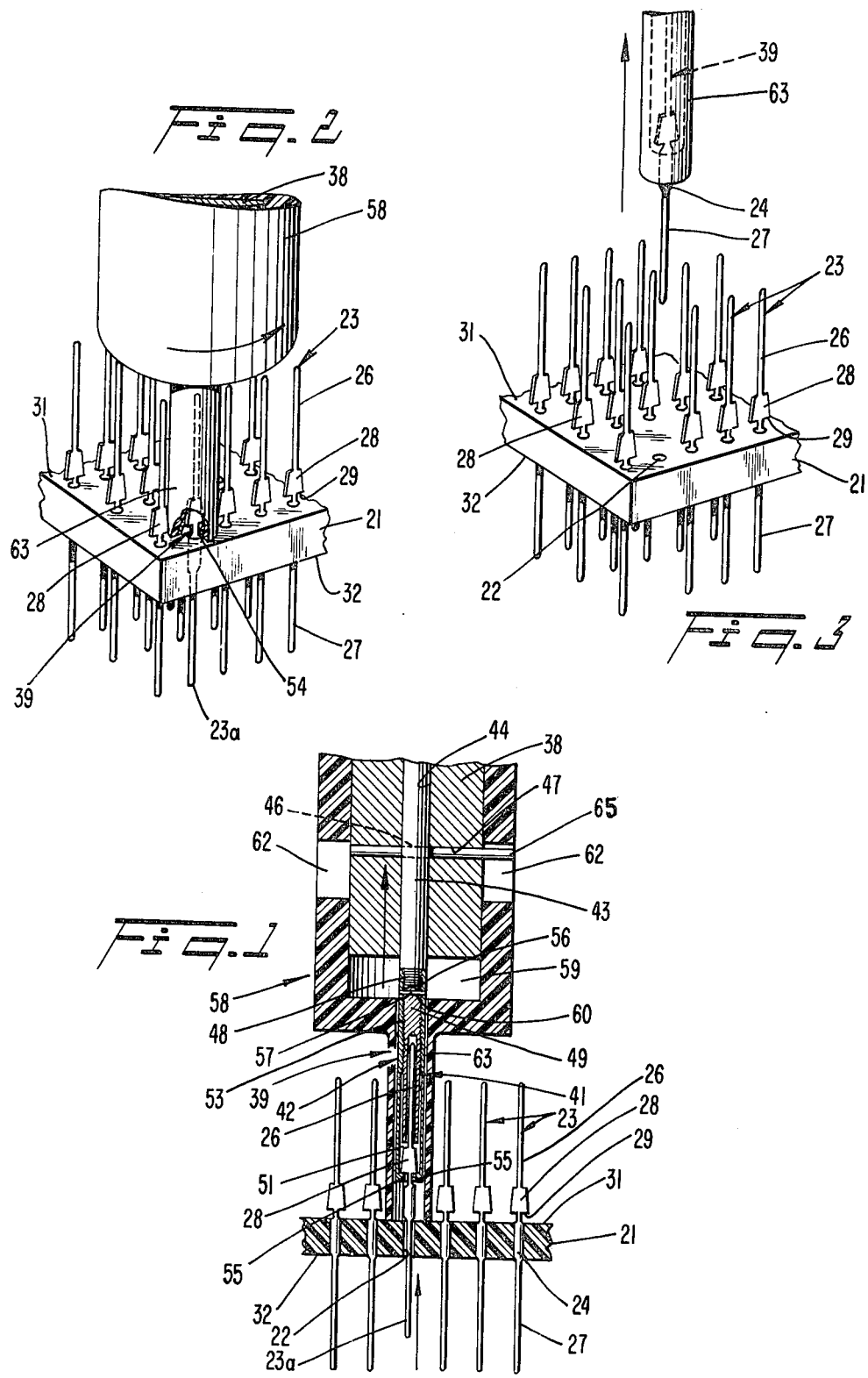

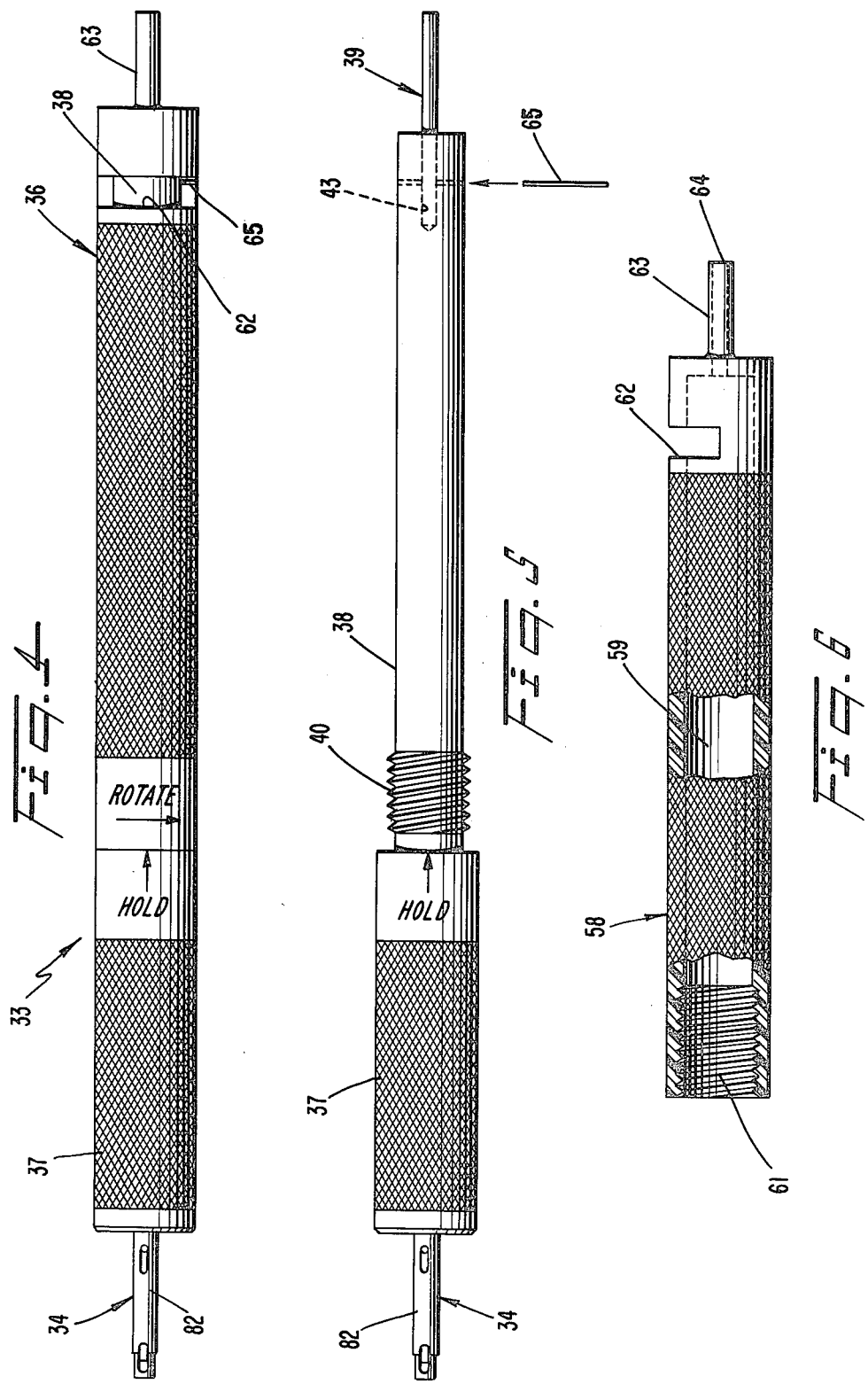

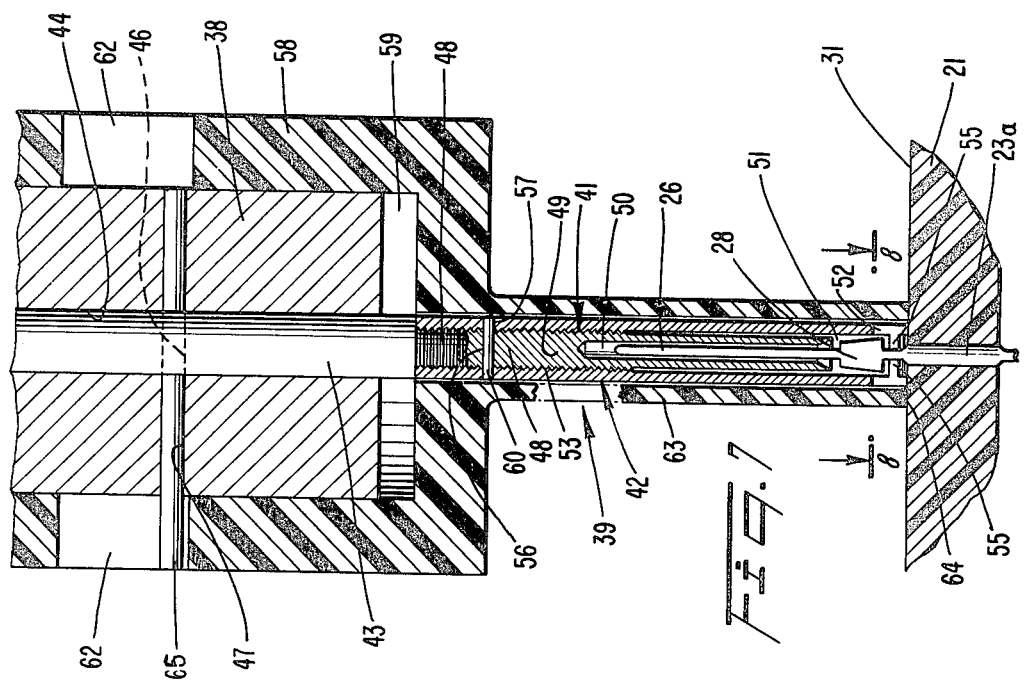
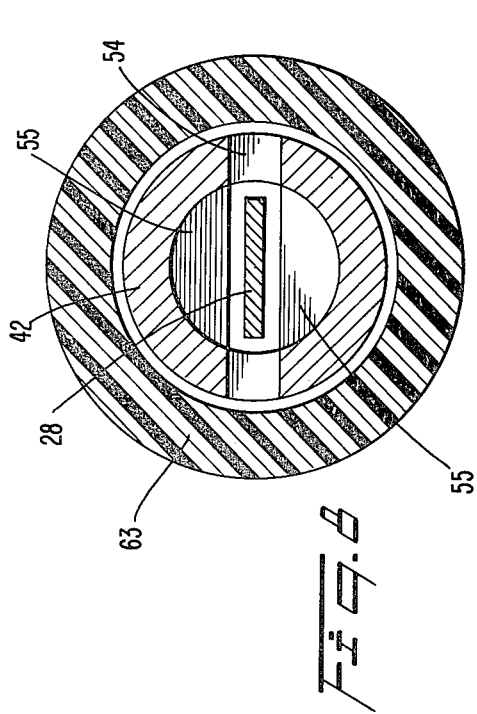
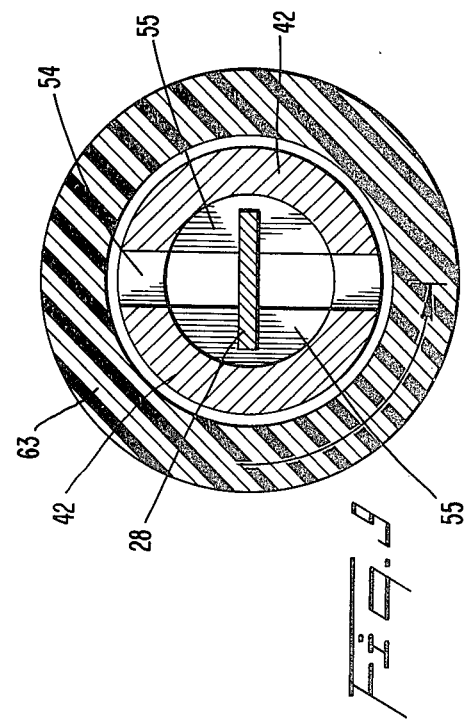

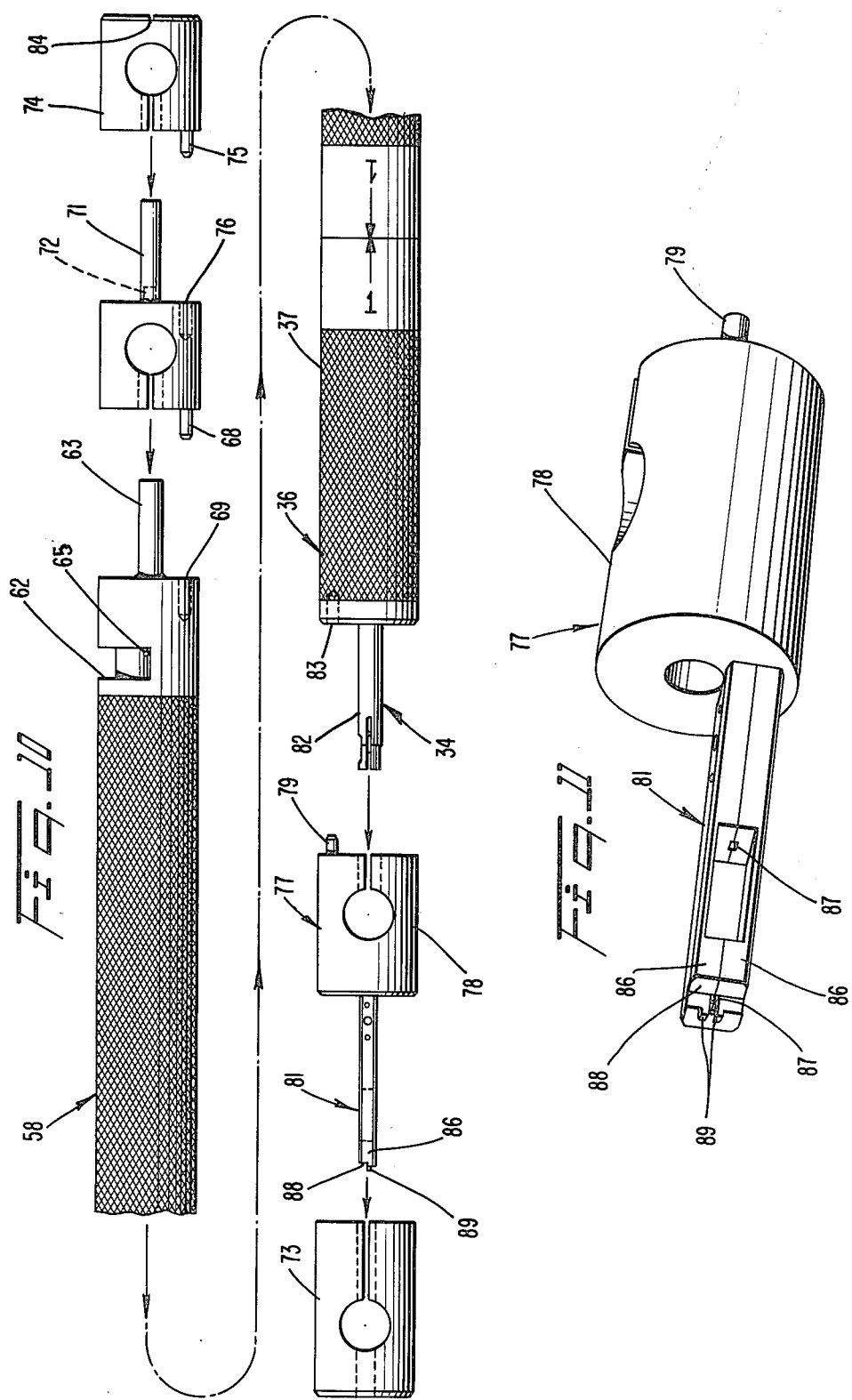

PIN REMOVAL TOOL

TECHNICAL FIELD

This invention relates to a pin removal tool and particularly to a tool for removing defective or damaged shouldered pins from apertures of a support.

BACKGROUND OF THE INVENTION

In some types of electronic equipment used for interconnecting purposes, a plurality of slender, electrical contact pins formed with shoulders are inserted into apertures of a support, such as a printed wiring board, in closely spaced rows or arrays to form a back plane assembly. Edge board connectors of other printed wiring boards are ultimately mated with the back plane-supported pins which are referred to as in-board pins. Occasionally, during manufacturing assembly or in a field repair operation, one or more of the plurality of closely spaced pins which have been inserted into the apertures of the printed wiring board may be defective or become damaged and hence must be extracted and replaced with new replacement pins. Frequently, there are other structures other than the closely spaced, slender in-board pins in the area of the defective or damaged pin. It is important that defective pins be removed axially thereof to avoid any rotational or lateral movement of the pins within the apertures which could result in damage to the integrity of the apertures and the printed wiring board. Due to the close spacing of the slender pins, difficulty also arises in positioning a tool over the defective pins for removal thereof while avoiding damage to adjacent pins.

U.S. Pat. No. 4,028,790, which issued to J. M. Dupuis, discloses a tool which is insertable over and facilitates removal of connector pins extending from and soldered to a support panel. The tool includes a main body which is held in contact with a surface of the panel. The main body member includes an axially sliding gripping member having a split gripping portion which is moved by a tubular member surrounding the gripping member and which, on axial movement, forces the split gripping portion of the gripping member into firm frictional contact with the pin. Moreover, further axial movement of the tubular member moves the gripping member and the pin axially thereby shearing the solder joint and withdrawing the pin. A pivotally mounted, laterally extending handle facilitates the movement of the tubular member. While the tool disclosed in the Dupuis patent could be used to withdraw the pins disclosed therein, the structure of the Dupuis tool is very bulky and could not be used in removing closely-spaced, slender pins. Also, the actuating elements of the Dupuis tool extend laterally therefrom. With this arrangement, the manual operation of the tool would tend to pull the tool laterally of the axis thereof and thereby damage the adjacent, closely spaced slender pins.

Consequently, there exists a need for a tool which will remove shouldered pins from an array of closely spaced pins in a printed wiring board in a manufacturing environment as well as in a field operation. In addition, the tool must maintain a position coaxial with the pin being removed to avoid damage to adjacent in-board pins and to maintain the integrity of the apertures of the printed wiring board.

SUMMARY OF THE INVENTION

The present invention relates to a tool for removing a pin from a support where the pin is formed with a portion extending laterally from the axis thereof. To accomplish the foregoing, the tool includes a casing, a pin-removal member positioned for movement within the casing and means for axially moving the pin-removal member within the casing upon rotation thereof. The invention further includes means formed on the pin-removal member for capturing the laterally extending portions of the pin with the pin-removal member so that upon rotation of the casing, the pin-removal member moves axially within the casing to withdraw the captured pin from the support.

BRIEF DESCRIPTION OF THE DRAWINGS

FIGS. 1, 2 and 3 are perspective views showing the removal of a pin from a support by using a tool embodying certain principles of the invention;

FIG. 4 is a view of a pin-insertion and pin-removal facility;

FIGS. 5 and 6 are views of portions of the pin-removal tool of FIGS. 1, 2 and 3;

FIG. 7 is a sectional view showing the pin-removal tool positioned over a pin to be removed;

FIGS. 8 and 9 are sectional views based on a view taken along line 8—8 of FIG. 7 showing the pin in different positions within the pin-removal tool;

FIG. 10 is a view of each of the ends of the pin-insertion and pin-removal facility showing various pin-insertion and removal attachments to be used with the facility of FIG. 4; and FIG. 11 is a perspective view of the pin inserter.

DETAILED DESCRIPTION

Referring to FIG. 1, there is illustrated a support, such as a printed wiring board, designated generally by the numeral 21, formed with apertures 22 for supporting a plurality of rows of contact pins, designated generally by the numeral 23, and referred to as in-board pins. Each pin 23 is formed with an intermediate compliant section 24 and upper and lower shanks 26 and 27, respectively. Each pin 23 also includes portions 28 which extend laterally from an intermediate section of the shank 26 and on which are formed lower shoulders 29. For the purposes of discussion, the shoulders 29 are located adjacent to a side of the board 21 hereinafter referred to as a component side 31 and the opposite side of the board hereinafter will be referred to as a wiring side 32 of the board. The pins 23 are mounted into the apertures 22 of the board 21 in a 0.125 inch grid pattern. The shanks 26 and 27 of the pins 23 are of a square cross section having a slender dimension of 0.025 inch per side. Adjacent pins 23 are spaced apart by about 0.100 inch and are arranged therefore in an extremely close array.

The pins 23 are manufactured from a blank sheet (not shown) of copper-nickel-tin alloy in a punch and die operation. During the formation of each pin 23, shear surfaces are formed along opposite edges as the pin is punched from the blank sheet. In particular, the shanks 26 and 27 have four sides with two opposite sides being formed by the shear surfaces. The remaining two surfaces of the shanks 26 and 27 are formed from the flat major surfaces of the blank sheet and are ultimately gold plated in preparation for mating connection with other facilities.

When the pins 23 are mounted in the board 21, the lower shoulders 29 of each pin are located 0.060 inch from the component side 31 of the board to form a space therebetween. Ultimately, the pin-populated board 21 serves as a back plane which is secured to the rear of an apparatus frame (not shown). A spacer aligner (not shown) is attached to edge portions of the board 21 to insure alignment of the board with the frame. Other printed circuit boards (not shown) are inserted into the frame so that edge board connectors (not shown) mounted on the leading edge of each of the other boards electrically mate with associated ones of the pins 23 to provide an interconnecting facility.

As is best shown in FIGS. 1, 2 and 3, when one of the in-board pins 23 is damaged or defective, such as pin 23a, the damaged or defective pin is extracted from the board 21. It is essential that the extraction of the damaged pin 23a be accomplished carefully to avoid damaging the printed wiring board 21 and disturbing the integrity of the aperture 22. Moreover, due to the close arrangement of the slender, spaced pins 23, removal must be accomplished without damaging the adjacent pins 23.

Referring to FIG. 4, there is illustrated a combined pin-removal and pin-insertion facility, designated generally by the numeral 33. A pin-insertion tool 34 is supported at a first end of the facility 33 and has been described in co-pending U.S. application Ser. No. 965,008, filed on Nov. 30, 1978, now U.S. Pat. No. 4,206,543 and assigned to the assignee of this application. The disclosure of the co-pending application Ser. No. 965,008 is incorporated herein by reference thereto. A pin-removal tool, designated generally by the numeral 36, extends from a second end of the facility 33.

Referring to FIG. 5, the tool 36 includes an insert such as a handle 37 having a shaft 38 integrally formed therewith and extending axially toward the second end of the facility 33. The handle 37 and the shaft 38 are constructed of a non-conductive material such as plastic. A set of external threads 40 are formed on a portion of the shaft 38 near the handle 37. Referring to FIGS. 1, 5 and 7, a pin-removal member, designated generally by the numeral 39, extends axially from the shaft 38. The pin-removal member 39 includes a shank retainer, designated generally by the numeral 41, and a shoulder receptor, designated generally by the numeral 42. An extension 43 of the shank retainer 41 is pressed into a bore 44 formed in the shaft 38 for axial alignment therewith. A cylindrical opening 46, formed laterally of the axis in the extension 43, is axially aligned with a transverse opening 47 formed in the shaft 38. The shank retainer 41 is formed with a set of external threads 48 on a reduced portion 49 extending from the extension 43. The reduced portion 49 is formed with a bore 50 for axially receiving the upper shank 26 of the pin 23a.

The shoulder receptor 42 is formed with an axial bore 51 extending from a first or open end of the receptor toward a cap 52 formed at a second or cap end of the receptor. A set of internal threads 53 are formed in the wall of the bore 51 adjacent to the open end of the receptor 42. A transverse cross-sectional slot 54, which is formed through the cap 52 and the cap end of the shoulder receptor 54, communicates with the bore 51. A pair of shoulder-retaining portions 55 are formed by internal surfaces of the cap 52 and are located on opposite sides of the slot 54.

As further illustrated in FIG. 7, the shoulder receptor 42 is placed over the shank retainer 41 and is threadedly attached thereto by virtue of the threads 48 and 53. A dowel pin 56 is inserted into aligned apertures 57 and 60 formed through the receptor 42 and the retainer 41, respectively, to fixedly secure the receptor to the retainer.

As illustrated in FIGS. 1, 6 and 7, the tool 36 further includes a sleeve, designated generally by the numeral 58, and having an outside diameter of 0.75 inch. The sleeve 58 includes an axial bore 59 with a set of internal threads 61 formed in a portion of the wall of the bore. The sleeve 58 is also formed laterally with a rectangular through slot 62 which communicates with the bore 59. Moreover, the sleeve 58 is formed with an axially-aligned end casing 63 having an outside diameter of 0.170 inch which is considerably less than the diameter of the sleeve. The end casing 63, which is formed with an axial opening, facilitates encasement of the pin-removal member 39 while permitting access to the pin-removal member through the axial opening. The casing 63 includes a seating end 64 which is located adjacent to the axial opening at the free end of the casing and is positionable onto the printed wiring board 21.

The sleeve 58 is placed over the shaft 38 until the pin-removal member 39 is located within the end casing 63. Rotation of the sleeve 58 threadedly attaches the sleeve to the shaft 38 by virtue of the threads 40 and 61. A pin 65 is inserted into the slot 62 of the sleeve 58, the transverse opening 47 of the shaft 38 and the cylindrical opening 46 in the extension 43 to retain the pin removal member 39 with the shaft. One end of the pin 64 extends into the rectangular slot 62 whereby movement of the pin is limited within the slot. Thus, the rotational movement of the sleeve 58, and the axial movement of the shaft 38 within the sleeve, are limited by virtue of the limited travel of the pin 64 within the slot 62.

To use the pin-removal tool 36, the pin-removal member 39 is positioned in axial alignment with, but spaced from, the defective pin 23a on the component side of the board 21. The tool 36 is then moved toward the printed wiring board 21 to position the upper shank 26 of the pin 23a within the bore 42 (FIG. 2). Upon continued movement of the tool 36, the laterally extending portions 28 are moved into the slot 44 (FIGS. 2, 7 and 8) and the lower shoulders 29 are moved past the plane of the shoulder-retaining portions 45 (FIG. 7). Eventually, the seating end 64 of the end casing 63 is moved into engagement with and bears firmly against the printed wiring board (FIGS. 2 and 7). The tool 36 is then rotated ninety degrees relative to the laterally extending portions 28 (FIG. 9) of the defective pin 23a. This moves the shoulder-retaining portions 55 into the space between the component side 31 of the board 21 and the adjacent lower shoulders 29 of the pin 23a to capture the laterally extending portions 28 of the pin 23a within the pin-removal member 39. While maintaining the seating end 64 firmly against the board 21 and the handle 37 in a non-rotational position, the sleeve 58 is rotated relative to the shaft 38. Rotation of the sleeve 58 causes the shaft 38 to move axially within the sleeve and away from the board 21 due to the threaded attachment between the shaft and the sleeve (FIG. 1). As mentioned above, the pin-removal member 39 is fixedly attached to the shaft 38. Thus, as the shaft 38 is moved away from the board 21, the shoulder-retaining portions 45 of the pin-removal member 39 engage the lower shoulders 29 of the defective pin 23a. As the shaft 38 continues to be moved axially away from the board 21 and the seating end 64 is held firmly against the board, a pushing force is exerted by the shoulder-retaining portions 55 against the lower shoulders 29 of the defective pin 23a to pull the pin axially from the aperture 22.

Since the shaft 38 and the pin-removal member 39 are not rotated during the period of removal of the pin 23a, the pin is not rotated during removal. The non-rotational, axial removal of the pin 23a avoids damage to the integrity of the aperture 22 and the board 21 during pin removal. Also, by holding the seating end 64 firmly against the board 21, the tool 36 is maintained in a position which is perpendicular to the board thereby avoiding damage to the pins 23 which are adjacent to the pin 23a being removed. Further, the relatively small diameters of the pin-removal member 39 and the end casing 63 permit the removal portion of the tool 36 to be positioned within the confined space between surrounding pins 23 during removal of pin 23a without damage to the adjacent pins. Also, other working portions of the tool 36, such as the sleeve 58, the handle 37 and the shaft 38, do not have to be inserted into the confined space. Therefore, these working portions of the tool 36 can be of a larger size which facilitates easy manual manipulation and provides sturdy support for the entire tool.

Referring to FIG. 10, an attachment, designated generally by the numeral 66, facilitates the removal of defective or damaged pins 23a from the wiring side 32 of the board 21. The attachment 66 is useful when the shoulders 29 of the pin 23a are damaged so as to prevent the use of the tool 36 as described above. Also, when the board 21 is mounted into the apparatus frame, the spacer aligner is positioned adjacent to some of the pins 23 on the component side of the board. The closeness of the spacer aligner prevents the use of the tool 36 in removing any defective pin 23a from the component side of the board 21 where the defective pin is adjacent to the spacer aligner. Therefore, the pin 23a must be pushed from the wiring side of the board 21 by use of the attachment 66.

The attachment 66 includes a body 67 which is positionable over the end casing 63 and interfaces with the end of the sleeve 58. A dowel pin 68, which is attached to one face of the attachment 66, fits into an aperture 69 formed in a mating face of the sleeve 58 to prevent rotational movement of the attachment relative to the sleeve. A sleeve 71, having a diameter less than the diameter of the body 67, is integrally formed with and extends in axial alignment from the body. A metal insert 72 is secured within the base of the sleeve 71 adjacent to the body 67 to act as a stop for the tip end of the lower shank 27 of the pin 23a being removed. In use, the attachment 66 is mounted onto the end casing 63. The sleeve 71 is placed over the lower shank 27 of the pin 23a from the wiring side 32 of the board 21 until the tip end of the shank engages the metal insert 72. By exerting an impacting force against a cap 73 at the opposite end of the facility 33, the defective or damaged pin 23a is pushed out of the board 21 from the wiring side 32 to the component side 31 thereof.

As illustrated in FIG. 10, a cap 74 includes a dowel pin 75 which is secured to one face of the cap and extends therefrom. The cap 74 is designed to be placed over the sleeve 71 of the attachment 66 with the dowel pin 75 being inserted into an aperture 76 formed in a mating face of the attachment 66. When the pin-insertion tool 34 is being used, the cap 74 provides an impact surface for a suer of the tool. Additionally, the cap 74 is used as a safety cover to prevent injury to the tool user and damage to the sleeve 71 of the attachment 66 when the attachment is not in use.

As further illustrated in FIGS. 10 and 11, a pin inserter, designated generally by numeral 77, includes a body 78, a dowel pin 79 which is secured to and extends from one face of the body, and a pin-insertion member designated generally by the numeral 81. The pin-insertion member 81 is secured to and extends from one face of the body 78 and is parallel to and spaced from the axis of the body. The pin inserter 77 facilitates the insertion of pins 23 into apertures 22 of the printed wiring board 21 which are adjacent to the spacer aligner. The closeness of the spacer aligner to the adjacent aperture 22 prevents the use of the pin-insertion tool 34 described in the copending application noted above. Thus, by locating spatially the pin-insertion member 81 from the axis of the body 78, the insertion member can be positioned adjacent to the spacer aligner to permit the insertion of the pin 23 into the board 21 adjacent to the spacer aligner.

The structure of the body 78 facilitates placement thereof over a tubular guide member 82 of the pin-insertion tool 34. The dowel pin 79 fits into an aperture 83 to prevent rotational movement of the pin inserter 77 and to align the shoulders 29 of the pin 23 with a transverse line 84 on the cap 73. The pin-insertion member 81 includes two inwardly biased arms 86. A passageway 87, which receives and holds the upper shank 26 of the pin 23, is formed between the arms 86. When the pin 23 is properly inserted into the passageway 87, the arms 86 clamp the opposite shear surfaces of the shank 26 of the pin. This avoids any clamping of the plated surfaces of the shank 26 which could cause damage thereto. A portion of the pin-insertion member 81, at one end thereof, is cut away to form a step 88. The step 88 exposes a portion of the passageway 87, thus facilitating the insertion of the pin 23 into the passageway. A pair of spaced shoulders 89 are formed integrally with and extend from the free end of the pin-insertion member 81 and are located on each side of the passageway 87 for engaging respective ones of the portions 28 of the pin 23 when the pin is inserted into the passageway. The shoulders 89 are 0.016 inch high and permit the insertion of the portion 28 of the pin 23 to a position 0.016 inch below the outer plane of the spacer aligner. A user of the pin inserter 77 can visually align the line 84 with portions 28 of pin 23 adjacent to the aperture 22. The line 84 permits alignment of the shoulders 29 of the pin 23 with adjacent in-board pins whose shoulders are recessed in the spacer aligner and therefore are not accessible for prealignment purposes. The cap 74 also provides an impact surface when the pin inserter 77 is being used.

The cap 73 is formed with structure which facilitates the placement thereof over the pin-insertion member 81. When the attachment 66 is being used, the cap 73 provides an impacting surface for a user of the tool. Additionally, the cap 73 is used as a safety cover to prevent injury to the tool user and damage to the pin-insertion member 81 of the pin inserter 77 when the inserter is not in use.

What is claimed is:

1. A pin-removal tool for removing a pin from a support where the pin is formed with a portion extending laterally from the axis thereof, comprising:
   a casing;
   a pin-removal member positioned for movement within the casing;

means for axially moving the pin-removal member within the casing upon rotation of the casing; and means formed on the pin-removal member for capturing the laterally extending portion of the pin with the pin-removal member so that upon rotation of the casing the pin-removal member moves axially within the casing to withdraw the captured pin from the support.

2. The pin-removal tool as set forth in claim 1 wherein the means for axially moving comprises:

a sleeve formed at one end of the casing;

an insert having portions positioned with the sleeve;

means for securing the pin-removal member to one end of the insert to locate the pin-removal member within the casing; and means for attaching the insert within the sleeve to facilitate axial movement of the insert upon rotation of the sleeve.

3. The pin-removal tool as set forth in claim 2 which further comprises means for limiting the axial movement of the insert and the rotational movement of the sleeve.

4. The pin-removal tool as set forth in claim 3 wherein the limiting means includes:

a slot formed through the wall of the sleeve; and a pin mounted in the insert and having portions which protrude through the slot to limit the axial movement of the insert and the rotational movement of the sleeve.

5. The pin-removal tool as set forth in claim 2 wherein the attaching means includes:

a set of external threads formed on the insert; and a set of internal threads formed in an interior wall of the sleeve to facilitate threaded attachment between the insert and the sleeve.

6. The pin-removal tool as set forth in claim 2 wherein the pin includes a shank axially extending from the laterally extending portion with the portion having a shoulder formed along one edge thereof and wherein the pin-removal member includes:

a shank receptor formed with a bore for receiving the shank of the pin;

means for securing the shank receptor to the insert;

a shoulder retainer for engaging the shoulder of the pin during removal of the pin from the support; and means for attaching the shoulder retainer to the shank receptor.

7. The pin-removal tool as set forth in claim 6 wherein the shoulder retainer includes:

a bore;

a cap formed at one end of the bore;

a transverse cross-sectional slot formed through the cap and communicating with the bore; and means for retaining the shoulder of the pin within the shoulder retainer.

8. The pin-removal tool as set forth in claim 7 wherein the retaining means includes internal surfaces of the cap which engage the shoulder during removal of the pin.

9. A pin-removal tool for removing a pin from a support where the pin includes a shank and a pair of shoulders extending laterally on opposite sides of the shank in the same plane, comprising:

an insert;

a sleeve having a slot formed through a wall thereof;

means for attaching the insert within the sleeve to facilitate axial movement of the insert upon rotation of the sleeve;

a pin mounted in the insert having portions which protrude through the slot to limit the axial movement of the insert and the rotational movement of the sleeve;

a shank receptor formed with a bore for receiving the shank of the pin;

means for securing the shank receptor to the insert;

a shoulder retainer for engaging the shoulders of the pin during removal of the pin from the support;

means for attaching the shoulder retainer to the shank receptor; and a casing formed at one end of the sleeve and positioned about the shoulder retainer.

10. The pin-removal tool as set forth in claim 9 wherein the shoulder retainer includes:

a bore;

a cap formed at one end of the bore;

a transverse cross-sectional slot formed through the cap and communicating with the bore; and means for retaining the shoulders of the pin within the shoulder retainer.

11. The pin-removal tool as set forth in claim 10 wherein the retaining means includes a pair of shoulder-retaining portions formed by internal surfaces of the cap located on opposite sides of the slot.

12. The pin-removal tool as set forth in claims 2 or 9 wherein the insert includes:

a shaft which is insertable within the sleeve; and a handle formed with the shaft and extending from an end of the sleeve opposite the end at which the casing is formed.

* * * * *